(12) United States Patent
Shibamoto et al.

(10) Patent No.: US 6,563,212 B2
(45) Date of Patent: *May 13, 2003

(54) SEMICONDUCTOR DEVICE

(75) Inventors: Masanori Shibamoto, Urawa (JP); Masahiro Ichitani, Kodaira (JP); Ryo Haruta, Kodaira (JP); Katsuyuki Matsumoto, Hitachi (JP); Junichi Arita, Musashimurayama (JP); Ichiro Anjo, Koganei (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/046,204

(22) Filed: Jan. 16, 2002

(65) Prior Publication Data

US 2002/0066955 A1 Jun. 6, 2002

Related U.S. Application Data

(63) Continuation of application No. 09/077,190, filed on May 26, 1998.

(30) Foreign Application Priority Data

Nov. 28, 1995 (JP) ............................................... 7-308761

(51) Int. Cl.[7] ............................................... H01L 23/34
(52) U.S. Cl. .................. 257/712; 257/737; 257/778
(58) Field of Search ............................. 257/712, 737, 257/738, 778

(56) References Cited

U.S. PATENT DOCUMENTS 5,945,741 A    8/1999   Ohsawa et al.

6,172,419 B1    1/2001   Kinsman

FOREIGN PATENT DOCUMENTS

| | | |
|---|---|---|
| CA | 1261482 | 9/1989 |
| EP | 578307 | 1/1994 |
| EP | 637839 | 2/1995 |
| FR | 2721437 | 12/1995 |
| JP | 2-87537 | 3/1990 |
| JP | 2-284451 | 11/1990 |
| JP | 3-261165 | 11/1991 |
| JP | 4-110653 | 4/1992 |
| JP | 5-82567 | 4/1993 |
| JP | 5-326625 | 12/1993 |
| JP | 6-224246 | 8/1994 |
| JP | 7-142633 | 2/1995 |
| WO | 91/07777 | 5/1991 |
| WO | 92/06495 | 4/1992 |

OTHER PUBLICATIONS

Nikkei Electronics, Feb. 28, 1994, No. 602, pp. 111–117.

*Primary Examiner*—Roy Potter
(74) *Attorney, Agent, or Firm*—Mattingly, Stanger & Malur, P.C.

(57) ABSTRACT

A semiconductor device in which a semiconductor chip 1 is bonded by a metal bond 2 to one surface of a heat sink 4 formed of a material with a thermal expansion coefficient is close to he semiconductor chip 1, the heat sink 4 is glued to a stiffener with a silicon adhesive 5 with an elastic modulus of 10 MPa or less, a TAB tape 9 is glued to the stiffener 3 with an epoxy adhesive 6, and the semiconductor chip 1 is sealed with an epoxy sealing resin 8 with an elastic modulus of 10 GPa or more for protection from outside.

2 Claims, 17 Drawing Sheets

SEMICONDUCTOR DEVICE

This is a continuation application of U.S. Ser. No. 09/077,190, filed May 26, 1998.

TECHNICAL FIELD

The present invention relates to a semiconductor device and its manufacturing method, and more particularly to a technology which is effectively applied to a semiconductor device having an LSI package superior in heat radiation and reliability.

BACKGROUND ART

Advanced logic devices of late are achieving high speed by using higher operation frequencies and multiple bit signals. However, as the performance of semiconductor chips improves, in the conventional packages, that is, in packages including a lead frame, for example, the package size becomes large due to the limits of fabrication of the lead frame. Accordingly, when a package is mounted on a mounting board, the area of the mounting board occupied by the package and outer leads increases, so that the merits of high density integration of functions are reduced to some extent. Furthermore, owing to the improvement in the operation frequency by enhanced performance and the increased number of gates by high density device integration, power consumption increases. Under this situation, the semiconductor chips have come to generate large quantities of heat, and it is absolutely necessary to cope with the increase of pins and develop a lower thermal resistance package structure. In the conventional packages, sufficient measures for radiation of heat generated from the semiconductor chips have not been taken. A first technology to solve this problem is disclosed in JP-A-07-326625 in which a semiconductor chip (LSI) having connection terminals on the whole circuit area is mounted by the face-down bonding on a carrier substrate, and the space between the semiconductor chip and the carrier substrate is completely filled with a sealing resin. In addition, a heat spreader is provided on the reverse side of the semiconductor chip.

A second technology is revealed in JP-A-06-224246 in which the package includes a conductive substrate with a cavity for accommodating a semiconductor chip having a plurality of bonding pads and a flexible circuit stacked on the conductive substrate. The flexible circuit includes a wiring pattern and an area array of bumps formed on the pads on the surface of the circuit. Under those pads, there are a plurality of openings leading to the flexible circuit, patterned wiring traces to ground and the substrate. In stacking the flexible circuit to the substrate, a conductive adhesive is used which facilitates electrical connection of the ground pad whose opening is set in the substrate.

A third technology is described in JP-A-04-119653 in which a semiconductor chip is installed on a metal plate, an insulator is stacked on the metal plate so as to surround the semiconductor chip, and patterned outer leads for electrical conduction to an external circuit, such as a mounting board, are formed on the surface of the insulator.

A fourth technology is shown in JP-A-05-82567 in which a package comprises a substrate of ceramic or the like having a hole in the center, a cap having a TAB-LSI, which is to be connected to the substrate, bonded thereto by die bonding and sealing, and a sealing resin filled between the substrate and the TAB-LSI in such a way that the hole of the substrate is closed air-tightly. The die-bonded TAB-LSI is filled with a sealing resin, a pressure is applied to the TAB-LSI to complete the bonding and the whole circuit area of the TAB-LSI is covered with the sealing resin.

A fifth technology is discussed in Nikkei Electronics, No. 602, issued on Feb. 28, 1994 in which a heat radiator plate or the cover is bonded to a semiconductor chip (LSI chip) with an adhesive for heat dissipation, and the semiconductor chip and solder terminals are connected using a TAB tape. The TAB tape and the semiconductor chip are bonded together by flip chip connection, and the space between the TAB tape and the semiconductor chip is filled with a sealing resin. The whole package is supported by gluing the heat radiation plate or the cover to the TAB tape with an adhesive.

Nonetheless, even with the first to fifth technologies, if the heat radiation characteristic is given priority, the reliability after device-mounting decreases, or if the reliability is given priority, great heat radiation characteristic cannot be obtained. In other words, the contradictory relation between heat radiation characteristic and reliability has not been overcome.

More specifically, the high heat radiation characteristic depends on a thermal resistance between a chip and a package and a thermal resistance between the chip and air. To obtain a high heat radiation characteristic, it is necessary to use a high heat-conduction adhesive between the chip and the package and also use high heat-conduction materials for the chip and the package.

However, the reliability of the package cannot be improved only by using materials meeting the above-mentioned requirement. The present inventors have clarified that the packages of structures shown in the first to the fifth technology are unable to sufficiently deal with thermal stress due to the heat generated when the chip operates or when the chip is mounted on the circuit board.

An object of the present invention is to provide a semiconductor device adaptable to an increasing number of pins, in which high heat radiation characteristic and high reliability are compatible. Another object of the present invention is to provide a semiconductor device adaptable to an increasing number of pins, in which high heat radiation characteristic and high reliability are compatible.

The foregoing and other objects and the novel features of the present invention will be apparent from the description of the specification and the accompanying drawings.

DISCLOSURE OF INVENTION

In the semiconductor device according to the present invention, a semiconductor chip is bonded by metal bonding to one surface of the heat sink whose thermal expansion coefficient is close to that of the semiconductor chip. The heat sink is bonded to a stiffener with a silicon adhesive with an elastic modulus of 10 MPa or less. A TAB tape is bonded to the stiffener with an organic adhesive, such as an epoxy resin adhesive. The heat sink is bonded to the stiffener with a silicone adhesive of an elastic modulus of 10 MPa or less. The TAB tape is electrically connected to the electrodes of the semiconductor chip. The semiconductor chip sealed with a sealing epoxy resin with an elastic modulus of 10 GPa or more.

BEST MODE FOR CARRYING OUT THE INVENTION

Figure 1:
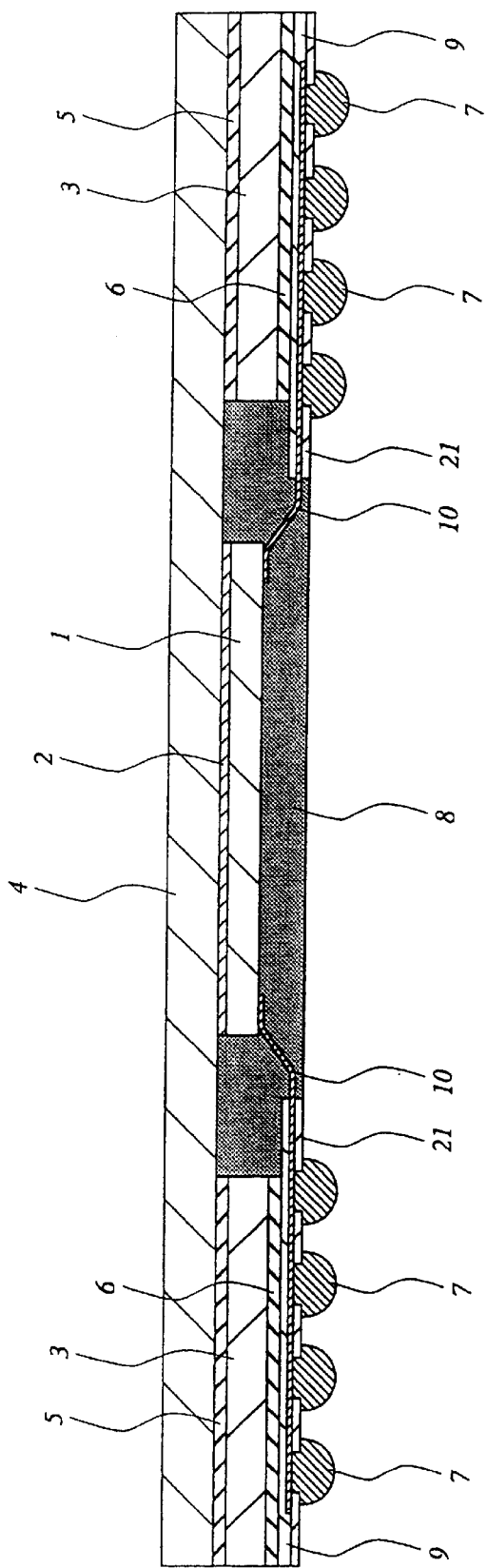
FIG. 1 is a sectional view of a semiconductor device according to a first embodiment of the present invention.

The embodiments of the present invention will be described with reference to the accompanying drawings. In all the drawings for describing the embodiments, the same functions are designated by the same reference numerals so as not to repeat their descriptions.

First Embodiment

Figure 2:
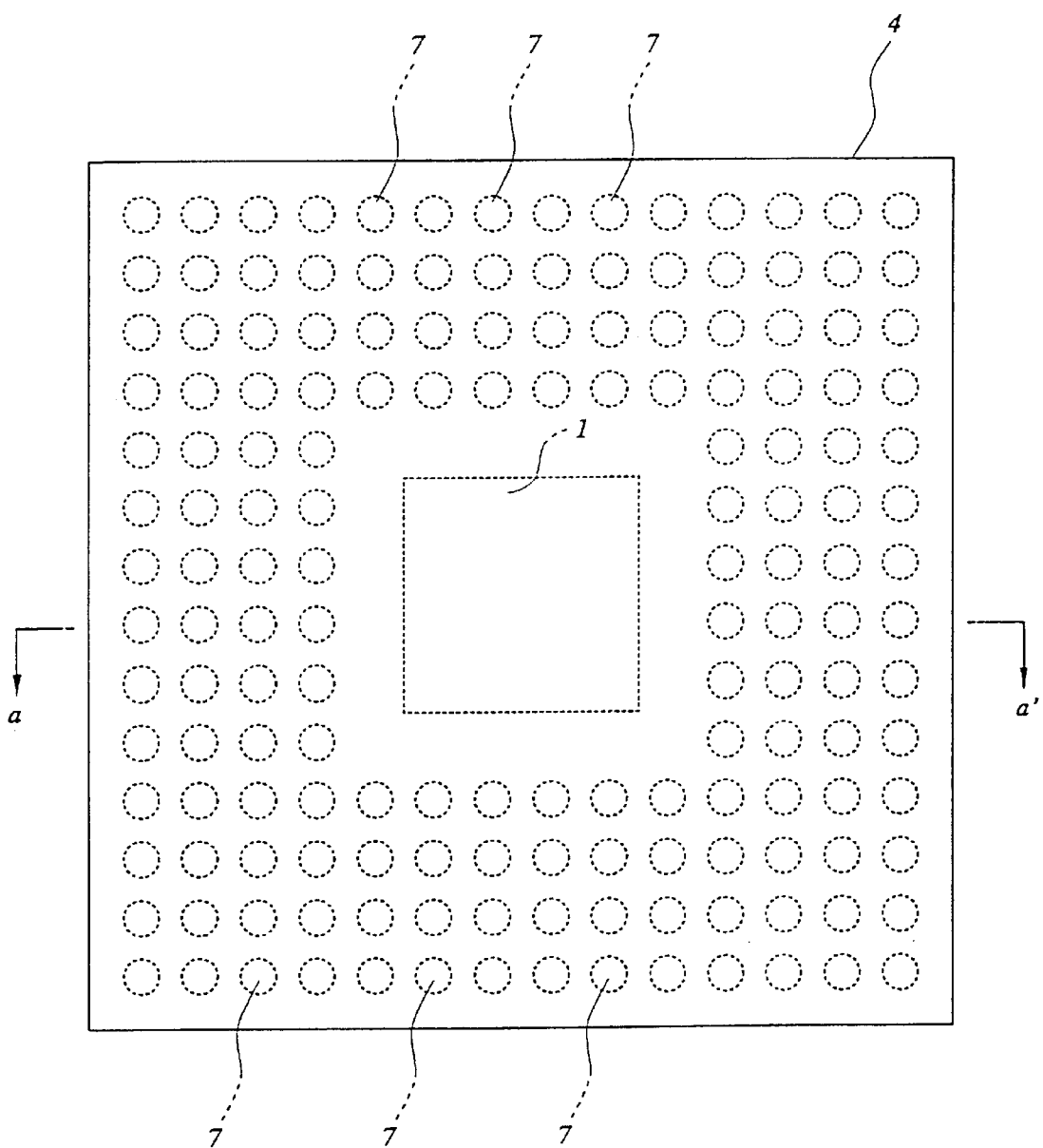
FIG. 2 is a plan view of the semiconductor device according to the first embodiment of the present invention.

FIG. 1 is a sectional view (taken along the lines a–a' in FIG. 2) showing the semiconductor device, and FIG. 2 is a plan view of the semiconductor device.

The semiconductor device according to this embodiment has a package structure of BGA (Ball Grid Array) type. This package comprises a semiconductor chip 1 having a logic LSI, such as a gate array, formed on the principal surface of the silicon substrate, a stiffener 3 surrounding the semiconductor chip 1, a heat sink 4 for externally radiating the heat generated in the semiconductor chip 1, a sealing resin 8 for protecting the semiconductor chip 1 from the external environment, which has wiring 10 formed on one surface thereof, and solder bumps 7 as lead-out electrodes. The thicknesses of the materials constituting the package are 0.28–0.55 mm for the semiconductor chip 1, 0.10–0.60 mm for the stiffener 3, 0.10–1.00 mm for the heat sink 4, and 0.05–0.125 mm for the TAB tape 9. The diameter of the solder bumps 7 is 0.3–0.9 mm.

The semiconductor chip 1 is bonded to the central portion of one surface of the heat sink 4 by an Au—Sn eutectic alloy 2. The bonded surface of the semiconductor chip 1 is a surface without the LSI. One surface of the stiffener 3 is glued to the peripheral area of one surface of the heat sink 4 with a first adhesive 5. The TAB tape 9 is glued to the other surface of the stiffener 3 with a second adhesive 6. End portions (inner leads) of the wiring 10 formed on the one surface of the TAB tape 9 are electrically connected to electrodes (not shown) of the semiconductor chip 1. The end portions (inner leads) of the wiring 10 and the semiconductor chip 1 are sealed together by a sealing resin 8. A plurality of solder bumps 7 electrically connected to the wiring 10 are formed at specified intervals on the other surface of the TAB tape 9. The region on the other surface of the TAB tape 9 where there are no solder bumps 7 is coated with a solder resist 21.

The package in this embodiment uses a metal (Au—Sn eutectic alloy 2) to bond the heat sink 4 and the semiconductor chip 1 together. Therefore, to secure reliability for the junction of the two layers, the heat sink 4 is formed by a material whose thermal expansion coefficient is close to that of the semiconductor chip 1. In the category of materials which have a thermal expansion coefficient close to $3 \times 10^{-6}/°$ C. of the semiconductor chip 1 and a high thermal conductivity, there are a Cu—W alloy (thermal expansion coefficient of $6 \times 10^{-6}/°$ C.; elastic modulus of 300 GPa), Fe-based alloy, mullite, AlN, carbon-based materials, such as diamond. For the metal by which to bond the heat sink 4 and the semiconductor chip 1 together, metals other than Au—Sn eutectic alloy mentioned above, such as an Au—Si alloy and a high-melting solder, may be used.

The stiffener 3 to brace the package is formed by a material having a thermal expansion coefficient close to the substrate on which the package is mounted. If the substrate is formed of a glass epoxy-based material (thermal expansion coefficient of $10-20 \times 10^{-6}/°$ C.; elastic modulus of 5–30 GPa), the stiffener 3 is formed by a glass epoxy material or a material having a thermal expansion coefficient similar to the glass epoxy material. Other examples of the material of the stiffener 3 are Cu alloy-based materials and organic materials. The shape of the stiffener 3 is not limited to the one shown in FIG. 1, but the stiffener 3 may be in any shape so long as it surrounds the semiconductor chip 1. The same shape as the stiffener 3 in FIG. 1 can be realized by gluing two or more cubes together.

The first adhesive 5 gluing the stiffener 3 and the heat sink 4 together is an adhesive material with an elastic modulus lower than that of the sealing resin 8 for sealing the semiconductor chip 1, that is to say, a material with an elastic modulus of 50 MPa or less, desirably, 10 MPa. The most desirable sealing resin is a silicon-based elastomer with an elastic modulus of 0.5–10 MPa (TX2206 by Toray Industries, for example). The thermal expansion coefficient of silicon-based elastomer is 300 or more$\times 10^{-6}/°$ C.

The second adhesive 6 gluing the stiffener 3 and the TAB tape 9 together is an adhesive material with a higher elastic modulus than the first adhesive 5, that is, an epoxy resin with an elastic modulus of 500–1000 MPa, for example. The TAB tape 9 for electrically connecting the semiconductor chip 1 and the solder bumps 7 is a flexible tape carrier comprising a synthetic resin base material having wiring 10 of an etched copper foil attached to one surface thereof. For the synthetic resin base material, for example, a polyimide base material (thermal expansion coefficient of $5-20 \times 10^{-6}/°$ C.; elastic modulus of 50–500 MPa), a glass epoxy base material, a polyester base material, or the like is used.

The sealing resin 8 for sealing one-end portions of the wiring 10 formed on the TAB tape 9 and the semiconductor chip 1 is a resin with a higher elastic modulus than the first adhesive 5 gluing the heat sink 4 and the stiffener 3 together, that is, an epoxy sealing resin with an elastic modulus of 5–30 GPa and a thermal expansion coefficient of $10-300 \times 10^{-6}/°$ C. The most desirable kind of the sealing resin 8 is an epoxy sealing resin with an elastic modulus of 10 GPa or more. Other materials, including an organic material with an elastic modulus of 5 GPa or more, such as a phenolic sealing resin or a polyimide sealing resin may be used.

For the lead-out electrodes formed on one surface of the TAB tape 9, besides solder bumps, various kinds of known electrodes adopted for surface mounting by area array connection may be used. For example, base electrodes having columnar or island-like metal terminals bonded thereto or nothing other than base electrodes may be used.

According to the semiconductor device in this embodiment arranged as described above, the semiconductor chip 1 and the heat sink 4 are bonded together by using a metal material (Au—Sn eutectic alloy 2) of a high thermal conductivity, which causes heat from the semiconductor chip to be conducted to the heat sink 4, thus greatly contributing to heat dissipation of the semiconductor chip 1. More specifically, in contrast to an Ag-containing organic adhesive (Ag paste) with a thermal conductivity of about 1–50 W/m K, the Au—Sn eutectic alloy 2 has a high thermal conductivity of about 200 W/m.K or more, making it possible to substantially improve the thermal conductivity compared with the case where an organic adhesive is used. The reduction in the difference in thermal conductivity between the heat sink 4 and the semiconductor chip 1 ensures the reliability of the junction between them. The high thermal conductivity of both the Au—Sn eutectic alloy 2 and the heat sink 4 greatly reduces the thermal resistance between the chip and the heat sink and the thermal resistance between the package and the air, so that a high heat radiation characteristic can be obtained.

According to the semiconductor device in this embodiment, since the adhesive 5 is used which has a lower elastic modulus and hence a higher elastic limit than the sealing resin 8 in gluing the heat sink 4 and the stiffener 3 together, it is possible to absorb and alleviate stresses produced by differences of thermal expansion coefficient among the members constituting the package. Accordingly, it is possible to prevent a package crack or breaking of wiring 10 due to thermal stress produced when the package is mounted on a circuit board or the LSI operates.

Further, according to the semiconductor device in this embodiment, since the sealing resin 8 is used which has a high elastic modulus to seal the semiconductor chip 1 and the wiring 10 (inner leads), the semiconductor chip 1 and the wiring 10 (inner leads) are fixed firmly by the sealing resin 8, so that the wiring 10 (inner leads) can be prevented from being broken by thermal stress.

Figure 3:
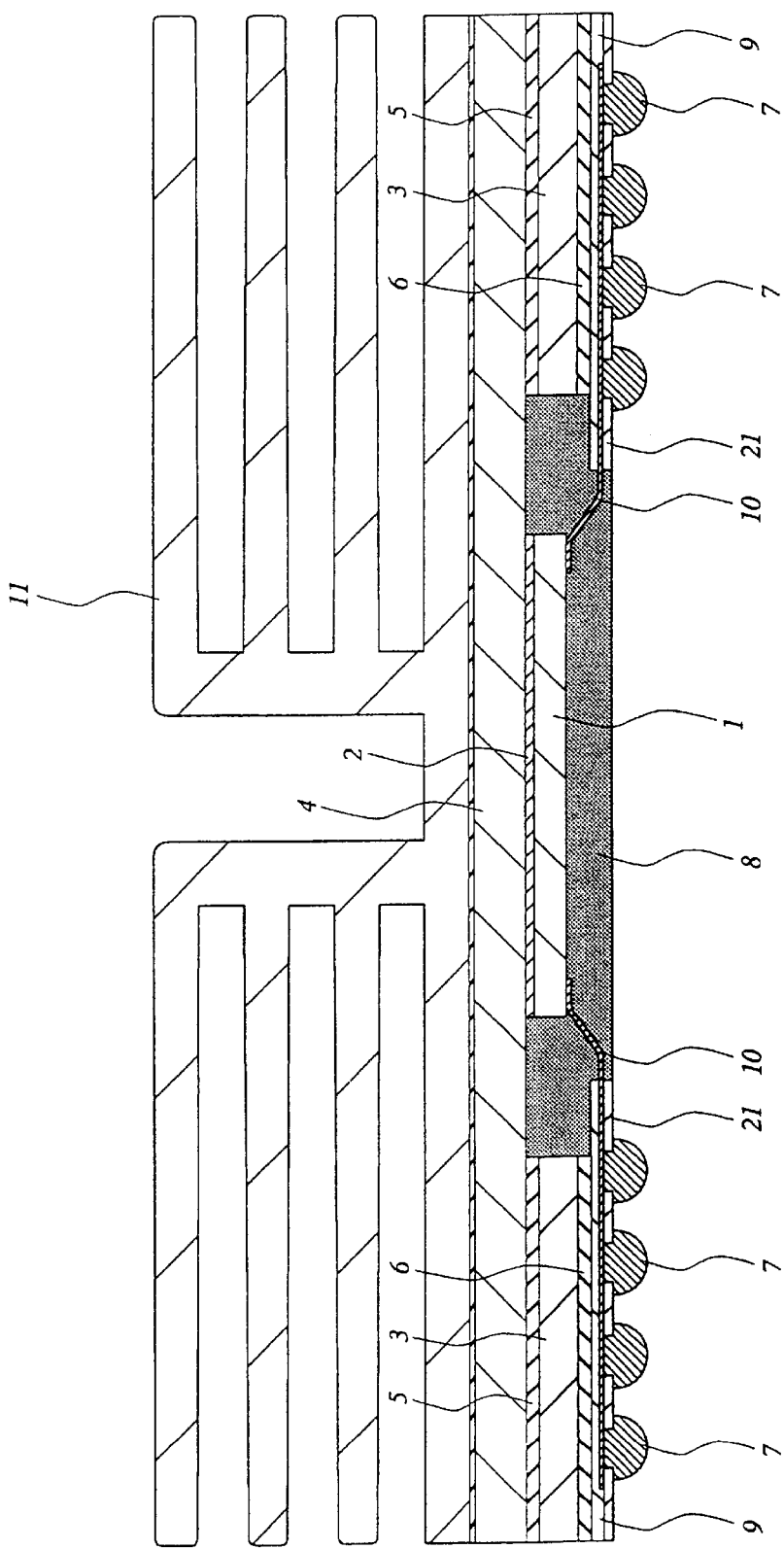
FIG. 3 is a sectional view of the semiconductor device according to the first embodiment of the present invention, on which heat radiation fins are installed.

As shown in FIG. 3, since radiation fins 11 are installed on top of the heat sink 4, the package according to this embodiment are applicable to multiple pin, increased power consumption LSIs. The fins 11 are formed by a metal material with a high thermal conductivity, such as Al, and are attached to the heat sink 4 using an adhesive such as grease. Or otherwise, the fins 11 may be fastened to the heat sink 4 with screws. The thickness and the shape of the fins 11 are not limited, but the fins 11 may be divided into a plurality of components. Optimum thickness and shape of the fins may be selected considering the generated heat value of the semiconductor chip 1, the material physical properties of the heat sink 4, production process, production cost, etc.

Figure 4:
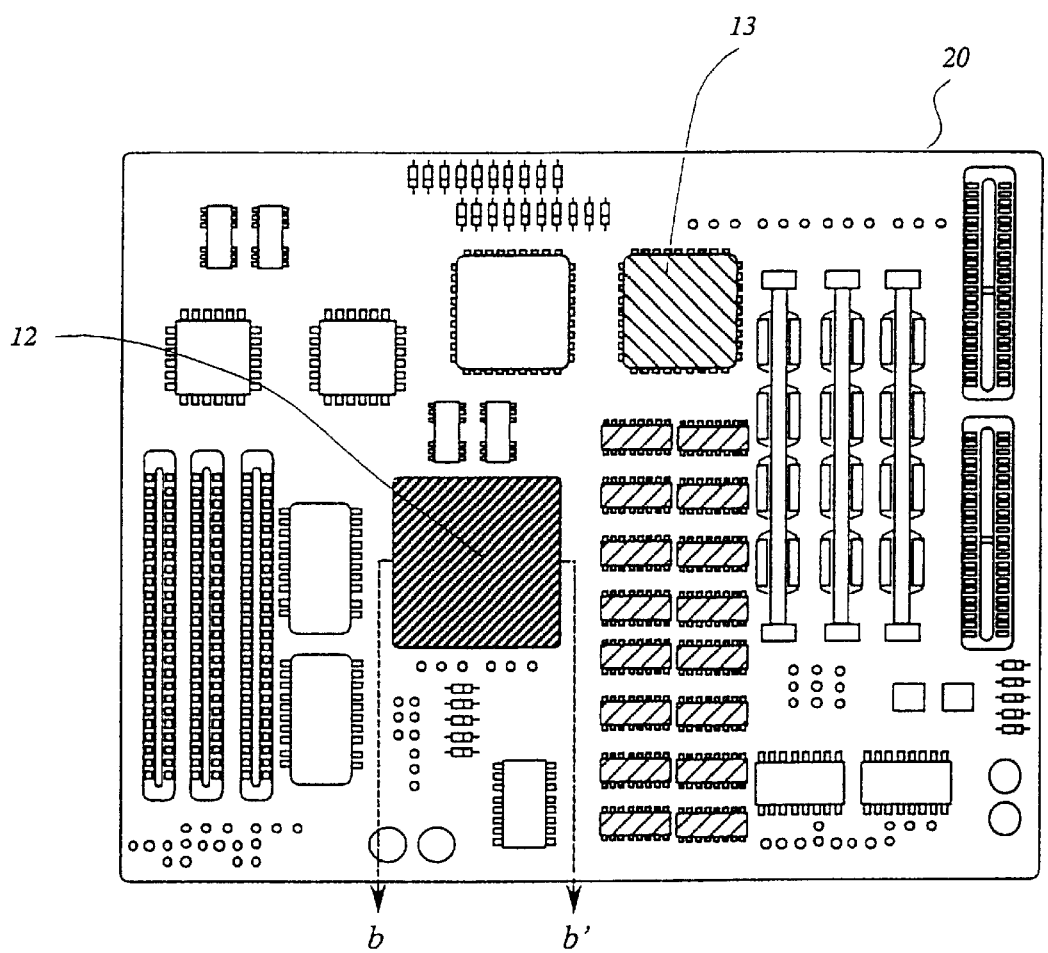
FIG. 4 is a plan view of a circuit board on which a semiconductor device according to the first embodiment is mounted.
Figure 5:
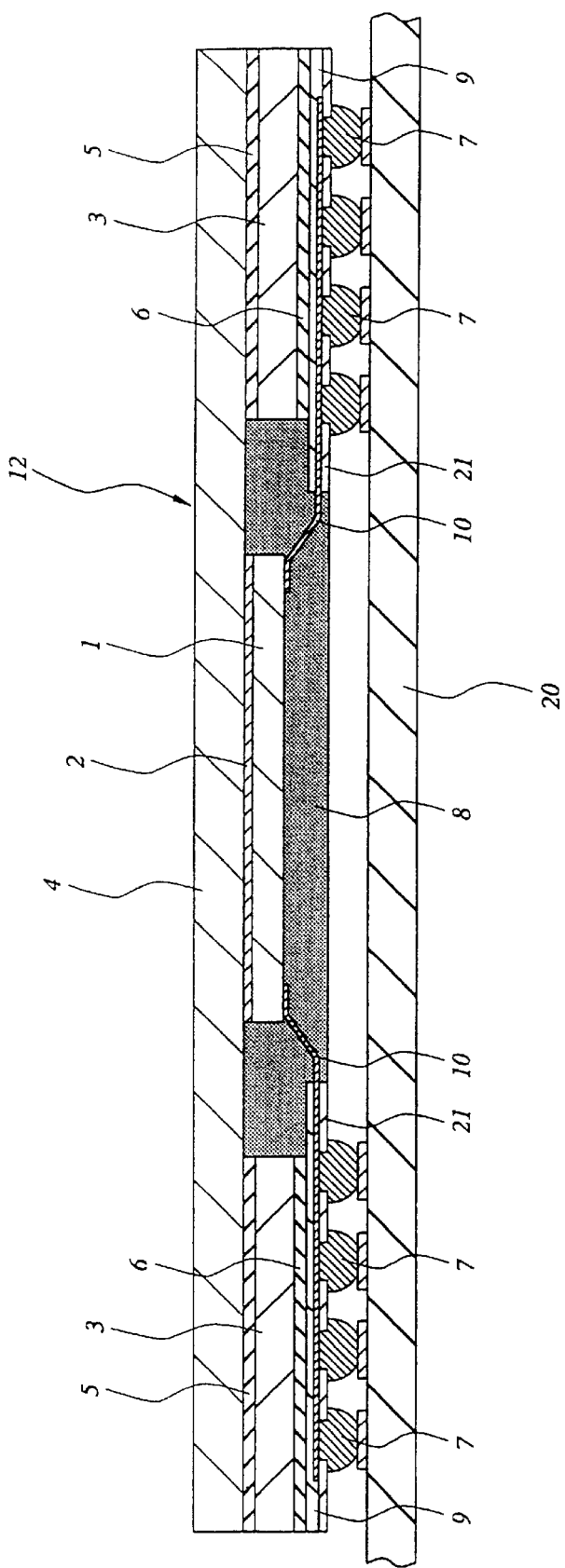
FIG. 5 is a sectional view taken along lines b–b' in FIG. 4.

FIG. 4 is a plan view showing an example of a condition in which a semiconductor device according to this embodiment is mounted on a mounting board 20 to be installed in a personal computer or a work station. FIG. 5 is a sectional view taken along the lines b–b' in FIG. 4.

In FIG. 5, reference numeral 12 denotes a package in this embodiment, and 13 denotes another type of a surface-mount package, such as a QFP (Quad Flat Package). Besides a gate array sealed in a package 12 according to this embodiment, other components mounted on this mounting board 20 are an MPU and logic LSIs sealed with a package such as a QFP or a PLCC (Plastic Leaded If Chip Carrier), and DRAMs sealed with a package such as an SOJ (Small Outline J-leaded Package).

In the package 12 according to this embodiment, the lead-out electrodes (solder bumps 7) are arranged in a two-dimensional array, so that the pin pitch is wider than in a QFP, the percent defective during mounting is far lower than in QFPs. A package 12 according to this embodiment can be soldered with other types of surface-mount packages, such as a QFP, by simultaneous reflow, which facilitates mounting of devices.

In the package 12 according to this embodiment, since the stiffener 3 for bracing the package 12 is formed of a material with a thermal expansion coefficient close to the circuit board 20, it is possible to prevent warping of the package 12 or breaking of a solder bump 7 which are caused by thermal stress produced during the operation of the LSI, and on account of this, the reliability of connection between the package 12 and the mounting board 20 can be improved.

Figure 6:
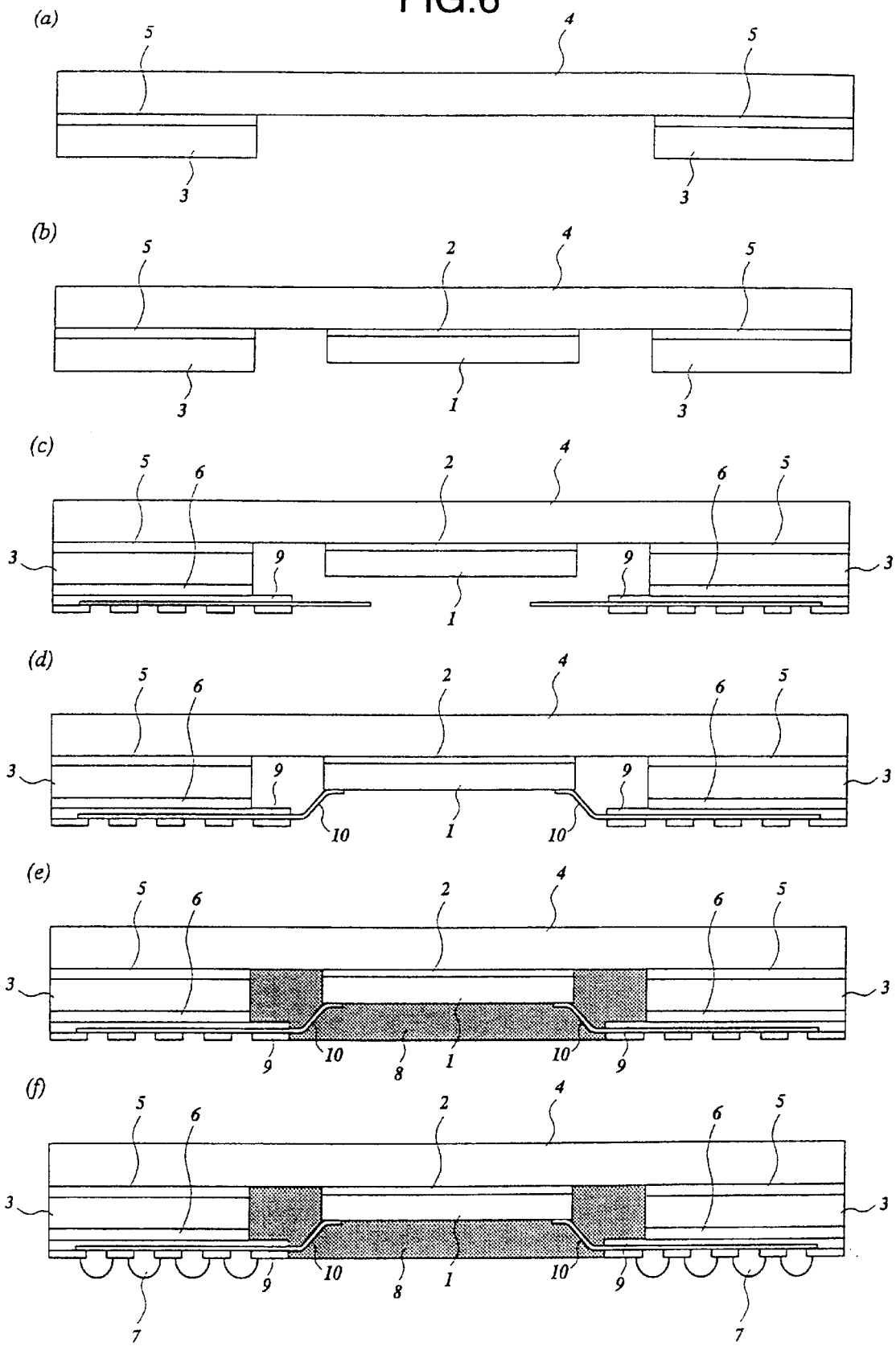
FIG. 6 is a process diagram showing the manufacturing process of the semiconductor device according to the first embodiment of the present invention.

The assembly process of the semiconductor device according to this embodiment will be described with reference to FIG. 6.

After a stiffener 3 is glued to one surface of a heat sink 4 with a first adhesive 5 as shown in FIG. 6(a), a semiconductor chip 1 is bonded to the central area of one surface of the heat sink 4 by using an Au—Sn eutectic alloy 2 as shown in FIG. 6(b). Or otherwise, the stiffener 3 may be attached after the semiconductor chip 1 is bonded to the heat sink 4. The temperature condition for bonding using the Au—Sn eutectic alloy 2 is 320 C. for about 10 min. The bonding temperature condition when using a metal other than the Au—Sn eutectic alloy 2 is as follows. If an Au—Si alloy or a high-melting solder is used, the bonding temperature is 370° C. for about two minutes for the former and 300° C. for about ten minutes for the latter.

As shown in FIG. 6(c), a TAB tape 9 is glued with a second adhesive to the other surface of the stiffener 3 which has been glued on the one surface thereof to the heat sink 4. In gluing the stiffener 3 and the TAB tape 9, a known thermocompression method is used. As shown in FIG. 6(d), end portions (inner leads) of the wiring 10 formed on the TAB tape are bonded to the electrodes of the semiconductor chip 1. If this bonding step is done by gang bonding, Au bumps or solder bumps should be formed on the electrodes of the semiconductor chip 1 in advance. The temperature condition for gang bonding is 500 C. for about one second. On the other hand, if the above bonding step is done by single bonding, bumps need not be formed on the electrodes of the semiconductor chip 1.

Referring to FIG. 6(e), after the semiconductor chip 1 and end portions (inner leads) of the wiring 10 are sealed with a sealing resin 8, as shown in FIG. 6(f), solder bumps 7 are formed on the TAB tape 9 such that they are electrically connected to the wiring 10. To form the solder bumps 7, solder balls are bonded to the TAB tape 9 and made to reflow at a temperature higher than the melting point of the solder.

The solder bumps 7 may be formed at the final step of the package assembly process, or just before the package is mounted to a mounting board.

In the semiconductor device according to this embodiment, the TAB tape 9 is used to connect the electrodes of the semiconductor chip 1 and the wiring 10, so that the wiring 10 can be bonded to the electrodes of the semiconductor chip 1 by gang bonding. Therefore, the time required for bonding does not depend on the number of pins and hence bonding can be finished in a short time.

In the package 12 according to this embodiment, since the stiffener 3 for bracing the package 12 is formed of a material having a thermal expansion coefficient close to the circuit board 20, it is possible to prevent the warping of the package 12 or the breaking of the solder bumps 7 which occur due to thermal stress produced during the operation of the LSI, so that the reliability of connection between the package 12 and the circuit board 20 can be improved.

Second Embodiment

Figure 7:
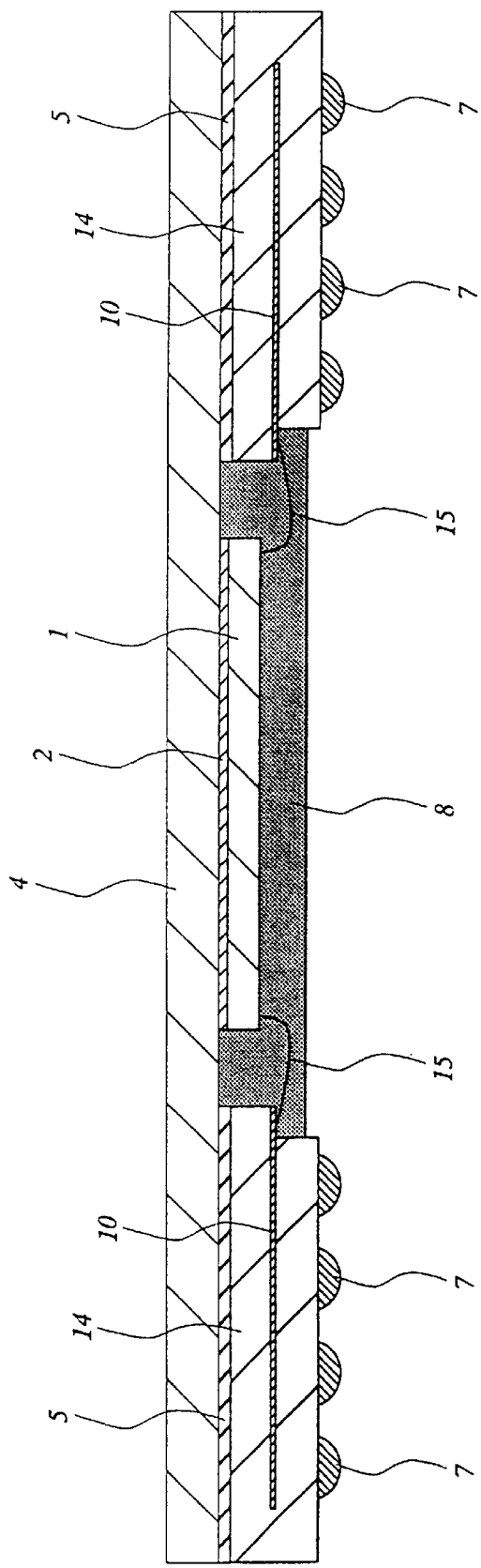
FIG. 7 is a sectional view showing a semiconductor device according to a second embodiment of the present invention.

FIG. 7 is a sectional view of the semiconductor device according to a second embodiment of the invention.

In the package in the first embodiment, the TAB tape 9 is attached to the stiffener 3 for bracing the package and the wiring on the TAB tape 9 is electrically connected to the electrodes of the semiconductor chip 1. In the package according to the second embodiment, the wiring 10 is formed on a stiffener 14 and the wiring 10 and the electrodes of the semiconductor chip 1 are electrically connected through a wire 15.

The semiconductor chip 1 is bonded to the central portion of one surface of the heat sink 4. The junction surface of the semiconductor chip 1 is a surface where there is not the LSI. The heat sink 4 is formed of a material having a thermal expansion coefficient close to the semiconductor chip 1 and a high thermal conductivity, such as a Cu—W alloy, an Fe-based alloy, mullite, AlN or a carbon-based material (diamond, for example). For the metal for bonding the heat sink 4 and the semiconductor chip 1 together, a metal other than Au—Sn eutectic alloy 2, such as an Au—Si alloy or a high-melting point solder may be used.

One surface of the stiffener 14 is glued to the peripheral portion of one surface of the heat sink 4 with an adhesive. The semiconductor chip 1 and wires 15 are sealed with a sealing resin 8. On the underside of the stiffener 14, a plurality of solder bumps 7 electrically connected to the wiring 10 are formed at specified intervals.

The stiffener 14 for bracing the package is formed of a material having a thermal expansion coefficient close to the circuit board where this package is to be mounted, such as a glass epoxy base material with a thermal expansion coefficient of $10-20 \times 10^{-6}/°$ C. and an elastic modulus of 10–20 GPa. The thickness of the stiffener 14 is 0.20–1.00 mm, for example. In the stiffener 14, there is provided a difference in level between the region where the wires 15 are connected and the region where the solder bumps 7 are formed so that the wires 15 can be sealed completely when the semiconductor chip 1 is sealed with the sealing resin 8. This difference in level is formed in such a way as to surround the semiconductor chip 1.

The adhesive 5 gluing the stiffener 14 and the heat sink 4 together is formed of a material with an elastic modulus lower than the sealing resin 8 for sealing the semiconductor chip 1, namely, 50 MPa or less, preferably 10 MPa or less. The most desirable kind of the sealing resin 8 is a silicone elastomer with an elastic modulus of 0.5–10 MPa. The sealing resin 8 for sealing the semiconductor chip 1 and the wires 15 is formed of a material with an elastic modulus higher than the adhesive 5, such as a phenolic sealing resin or a polyimide sealing resin with an elastic modulus of 5–30 GPa or more. The most desirable kind is an epoxy sealing resin with an elastic modulus of 10 GPa or more. Besides the solder bumps 7, other kinds of lead-out electrodes that can be formed on the underside of the stiffener 3 are various kinds of known electrodes adopted for surface mounting by area array connection, such as base electrodes having columnar or island-like metal terminals bonded thereto or nothing other than base electrodes.

According to the semiconductor device in the second embodiment arranged as described, since a metal material (Au—Sn eutectic alloy 2) with a high thermal conductivity is used to bond the semiconductor chip 1 to the heat sink 4, the heat generated in the semiconductor chip 1 can be conducted to the heat sink 4 with high efficiency, thus contributing a great deal to heat radiation of the semiconductor chip 1. By the reduction of the difference in thermal expansion coefficient between the heat sink 4 and the semiconductor chip 1 can ensure the reliability of the junction between these two layers. The high thermal conductivity of both the Au—Sn eutectic alloy 2 and the heat sink 4 substantially reduces the thermal resistance between the chip and the heat sink and thermal resistance between the package and the air, so that a high heat radiation characteristic can be obtained.

According to the semiconductor device of the second embodiment, since the adhesive 5 is used which has an elastic modulus lower than the sealing resin 8 and hence a high elastic limit to glue the heat sink 4 and the stiffener 14 together, the stresses produced due to differences in thermal expansion coefficient among the members of the package can be absorbed and lessened by the adhesive 5. Accordingly, it is possible to prevent a package crack or disconnection of the wiring 10 due to thermal stress produced when the package is mounted to a circuit board or when the LSI operates.

According to the semiconductor device of the second embodiment, since the sealing resin 8 with a high elastic modulus is used to seal the semiconductor chip 1 and the wires 15, the semiconductor chip 1 and the wires 15 are fixed firmly by the sealing resin 8, thus preventing the wires 15 from being broken by thermal stress.

According to the semiconductor device of the second embodiment, since the stiffener 15 for bracing the package is formed of a material with a thermal expansion coefficient close to the circuit board, the warping of the package and breaking of solder bumps 7 due to thermal stress produced during the operation of the LSI can be prevented, thus improving the reliability of the package and the circuit board.

In contrast to the package in the first embodiment, in the semiconductor device according to the second embodiment, the TAB tape 9 is not used, the number of parts and the number of assembly man-hours can be reduced. Therefore, the manufacturing cost of the package can be decreased compared with the package in the first embodiment.

Figure 8:
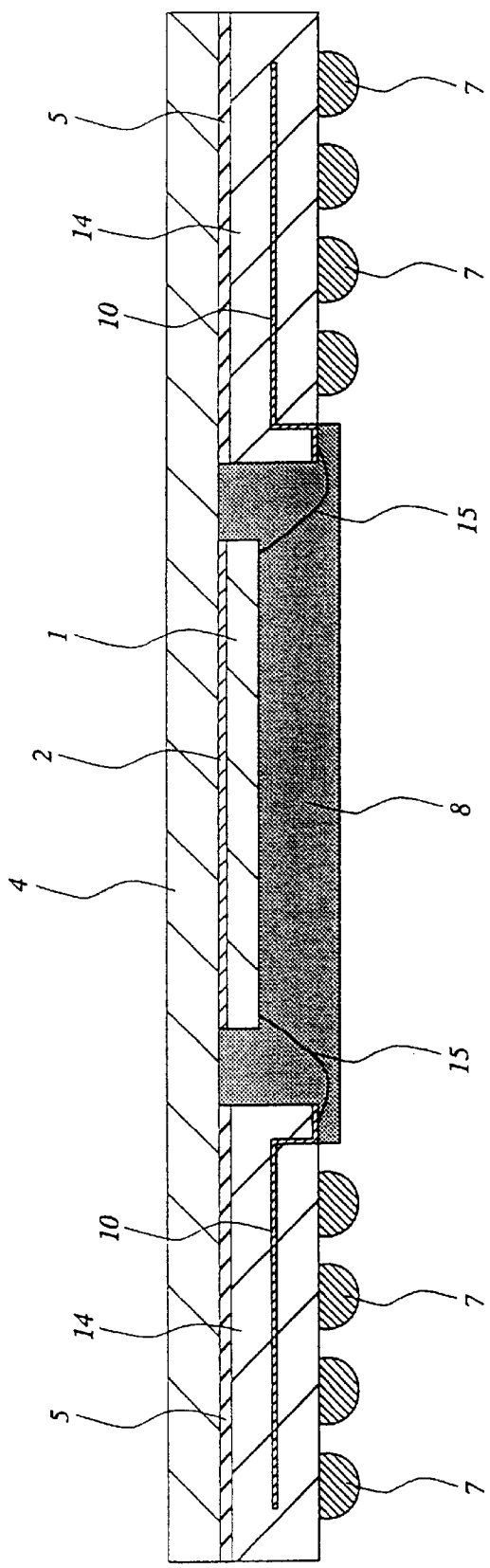
FIG. 8 is a sectional view showing the semiconductor device according to the second embodiment of the present invention.

As shown in FIG. 8, if the difference in level is not provided between the region where the wires 15 are connected at the underside of the stiffener 14 and the region where the solder bumps 7 are formed, the structure of the stiffener 14 is simplified, so that the manufacturing cost of the stiffener 14 can be reduced and therefore the cost of the package can be reduced.

Figure 9:
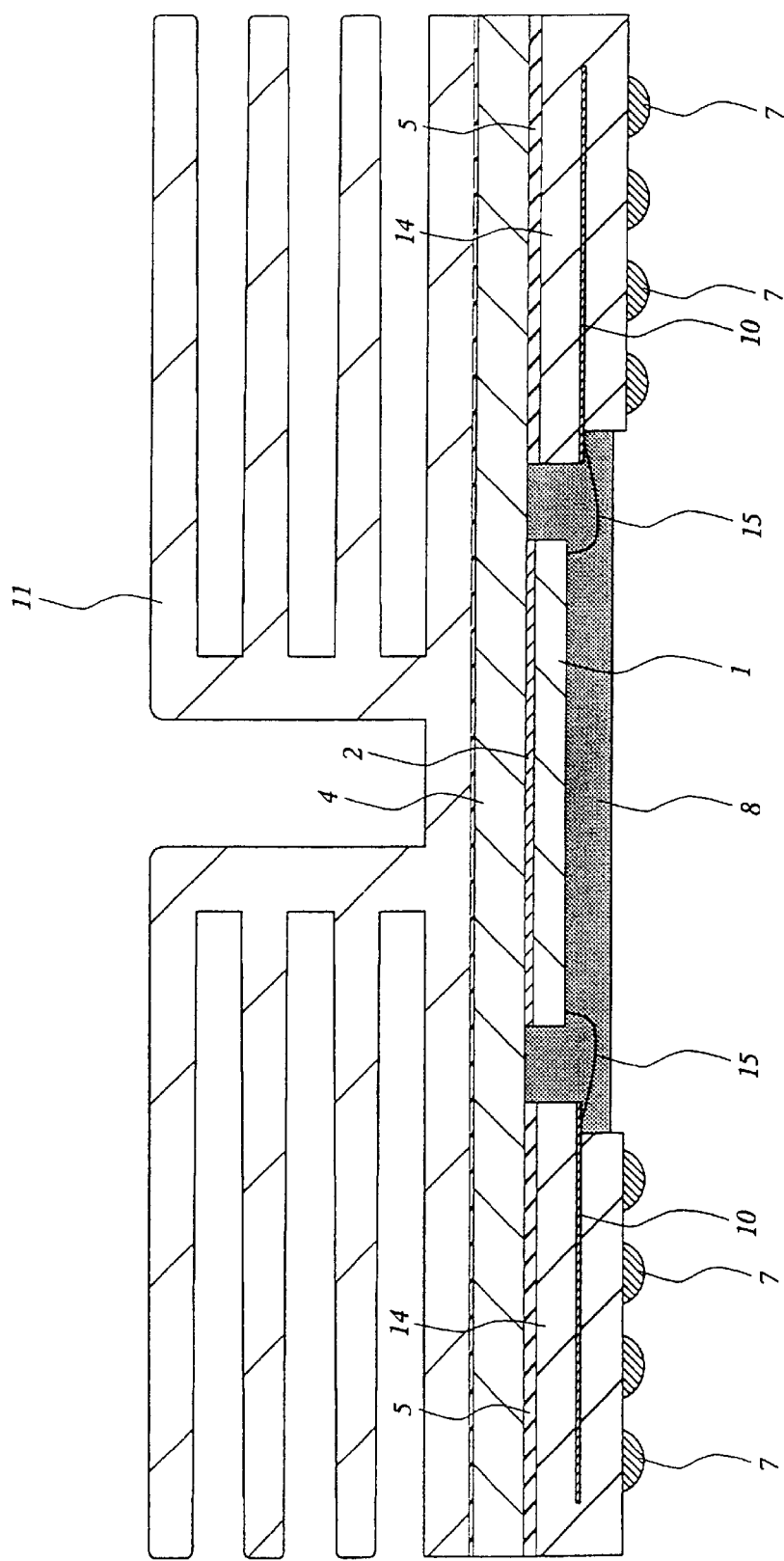
FIG. 9 is a sectional view showing the semiconductor device according to the second embodiment of the present invention, on which heat radiation fins are installed.

As shown in FIG. 9, in the package according to the second embodiment, by installing heat radiation fins 11 on top of the heat sink 4, the package can be applicable to multiple-pin, increased power-consumption LSIs. The fins 11 are formed of a metal material with a high thermal conductivity like Al, and are attached to the heat sink 4 using an adhesive such as grease. Or otherwise, the fins 11 may be screwed down to the heat sink 4. The thickness and the shape of the fins are not limited, but the fins may be divided into a plurality of components. Optimum thickness and the shape may be selected taking into account the generated heat value of the semiconductor chip 1, the material physical properties of the heat sink 4, production process, production cost, etc.

Figure 10:
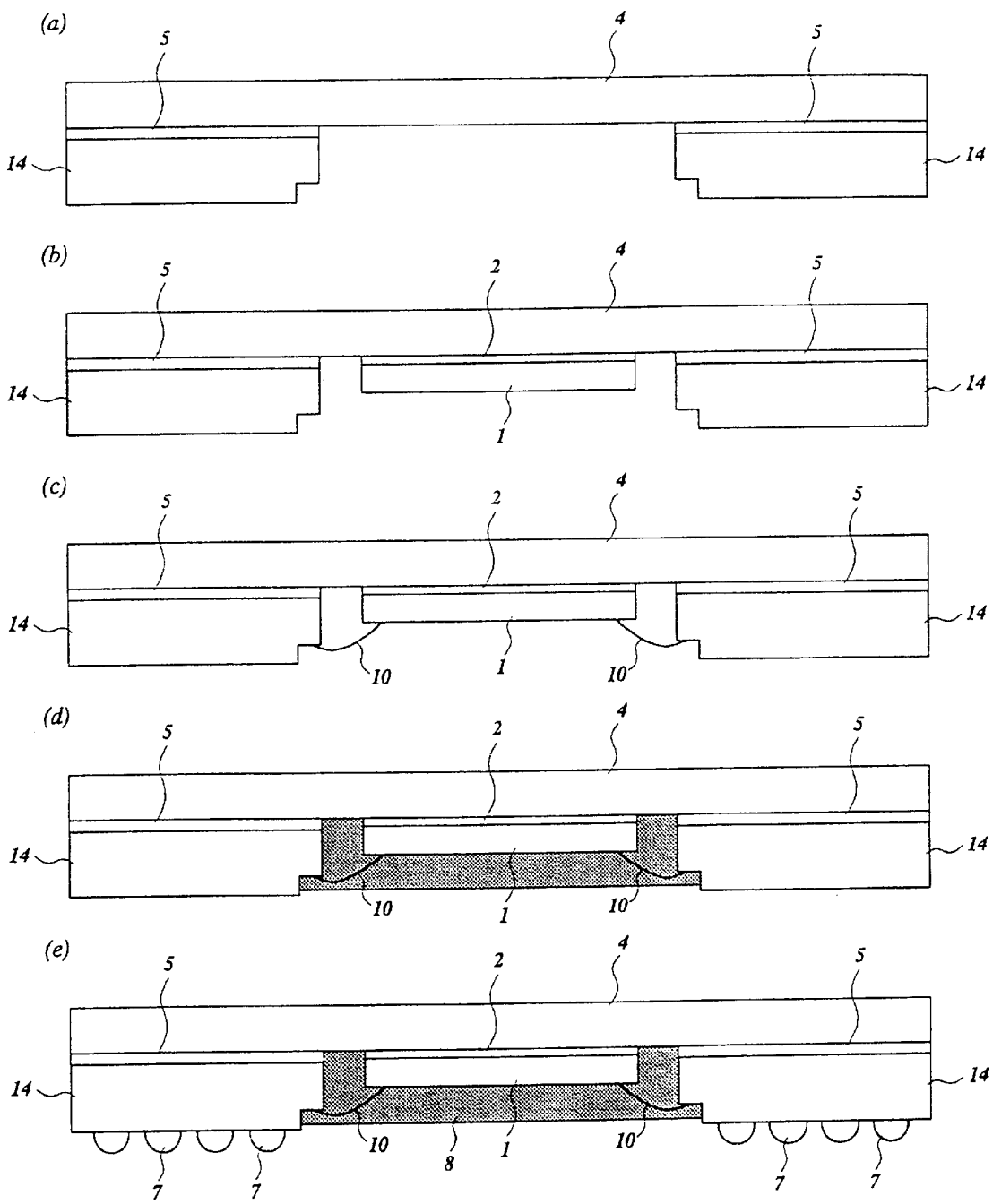
FIG. 10 is a process diagram showing the manufacturing process of the semiconductor device according to the second embodiment of the present invention.

With reference to FIG. 10, the assembly process of the semiconductor device according to the second embodiment will be described.

As shown in FIG. 10(*a*), after the stiffener 14 is glued to one surface of the heat sink 4 with an adhesive 5, the semiconductor chip 1 is bonded to the central portion of one surface of the heat sink 4 using the Au—Sn eutectic alloy 2 as shown in FIG. 10(*b*). Or otherwise, the stiffener 14 may be attached after the semiconductor chip 1 is bonded to the heat sink 4.

Figure 11:
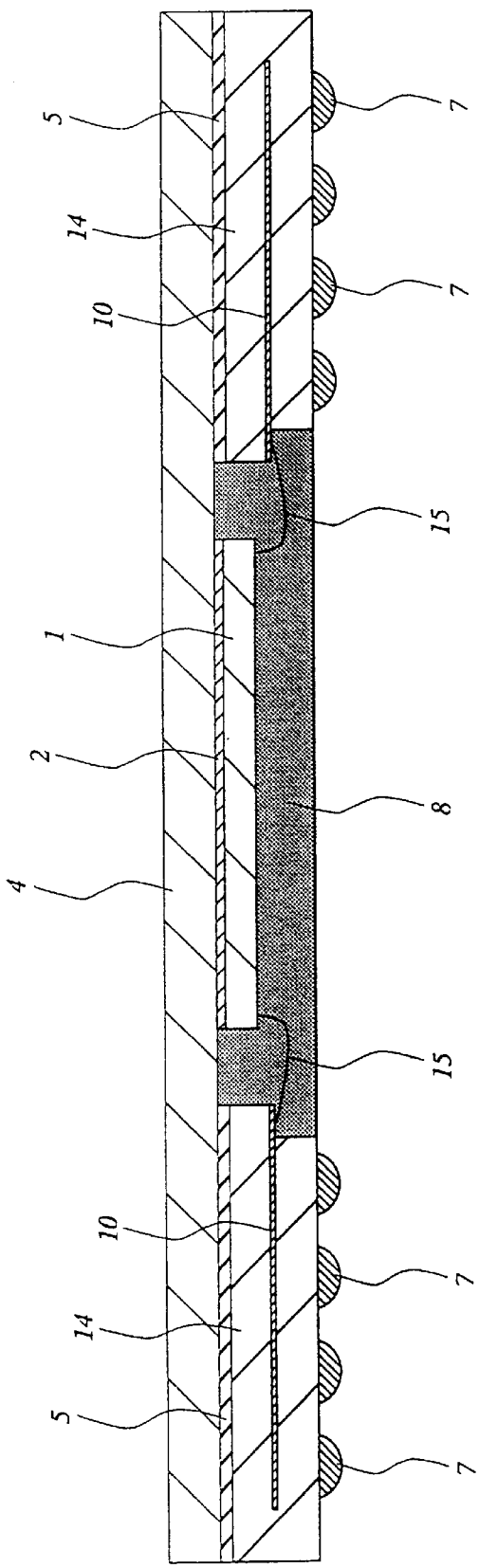
FIG. 11 is a sectional view showing the semiconductor device according to the second embodiment of the present invention.

After the electrodes of the semiconductor chip 1 and the wiring 10 of the stiffener 14 are connected with wires 15 using an automatic wire bonder as shown in FIG. 10(*c*), the semiconductor chip 1 and the wires 15 are sealed with a sealing resin 8 as shown in FIG. 10(*d*), and solder bumps 7 are formed on the underside of the stiffener 14 as shown in FIG. 10(*e*). By adjusting the thickness of the sealing resin 8 to eliminate the difference in level between the underside of the sealing resin 8 and the underside of the stiffener 14 as shown in FIG. 11, the underside of the package is made flat, which facilitates the work of bonding the solder balls to the underside of the stiffener 14. The formation of the solder bumps 7 may be done at the final step of the package assembly process or just before the package is mounted to a circuit board.

Third Embodiment

Figure 12:
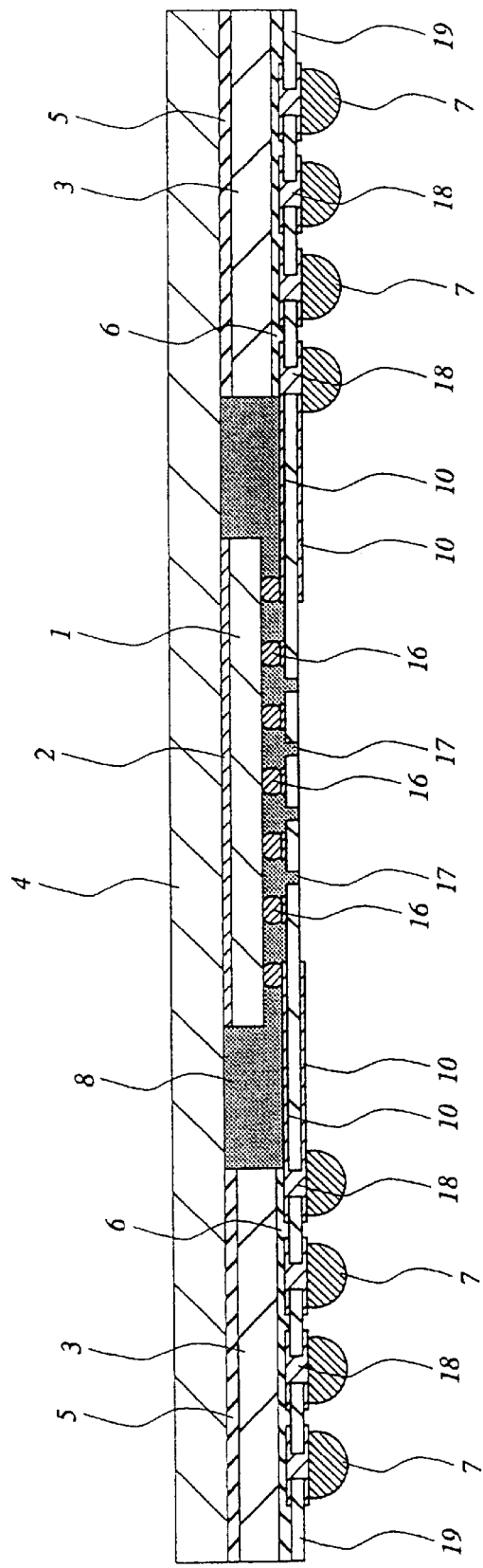
FIG. 12 is a sectional view showing a semiconductor device according to a third embodiment of the present invention.

FIG. 12 is a sectional view of the semiconductor device according to a third embodiment of the invention.

In a package according to the third embodiment, a flexible tape (a TAB tape) 19 having wiring 10 formed on both surfaces thereof is glued to one surface of the stiffener 3 with an adhesive 6 so that the wiring 10 of the flexible tape 19 is electrically connected to the electrodes of the semiconductor chip 1 through solder bumps 16. The semiconductor chip 1 and the solder bumps 16 are isolated from outside by the sealing resin 8 filled without leaving any space within the resin-sealed region.

For the base material of the flexible tape 19, like in the TAB tape in the first embodiment, a polyimide base material, a glass epoxy base material or a polyester base material is used. The wiring 10 formed on both sides of the flexible tape 19 is connected electrically via through-holes 18. A layout of the wiring 10 on one surface and that of the wiring 10 on the other surface of the flexible tape 19 are such that they overlap each other. Therefore, electromagnetic induction occurs on the wiring 10 on either side of the flexible tape 19 by the electrical characteristics of the currents flowing through the wiring 10, and by the interaction of electromagnetic induction of the wiring conductors on both sides, their inductances are reduced. The flexible tape 19 is provided in its central portion with via holes 17 for externally injecting the sealing resin 8 into a cavity region enclosed by the heat sink 4, the stiffener 3, and the sealing resin 8. A plurality of solder bumps 7, electrically connected with the wiring 10, are formed at specified intervals on the underside of the flexible tape 19.

The semiconductor chip 1 is bonded to the central portion on one surface of the heat sink 4 with an Au—Sn eutectic alloy 2 (or an Au—Si alloy, a high-melting solder or the like). The stiffener 3 for reinforcing the package is glued on one surface thereof to the peripheral portion of one surface of the heat sink 4 with an adhesive 5 with a low elastic modulus. The stiffener 3, the heat sink 4 and adhesives 5 and 6 are formed of the same materials as are used in the first embodiment.

According to the semiconductor device in the third embodiment arranged as mentioned above, like in the first and the second embodiment, improvements are achieved in the reliability and the heat radiation property of the package and the connection reliability of the packaged mounted on the circuit board.

Figure 13:
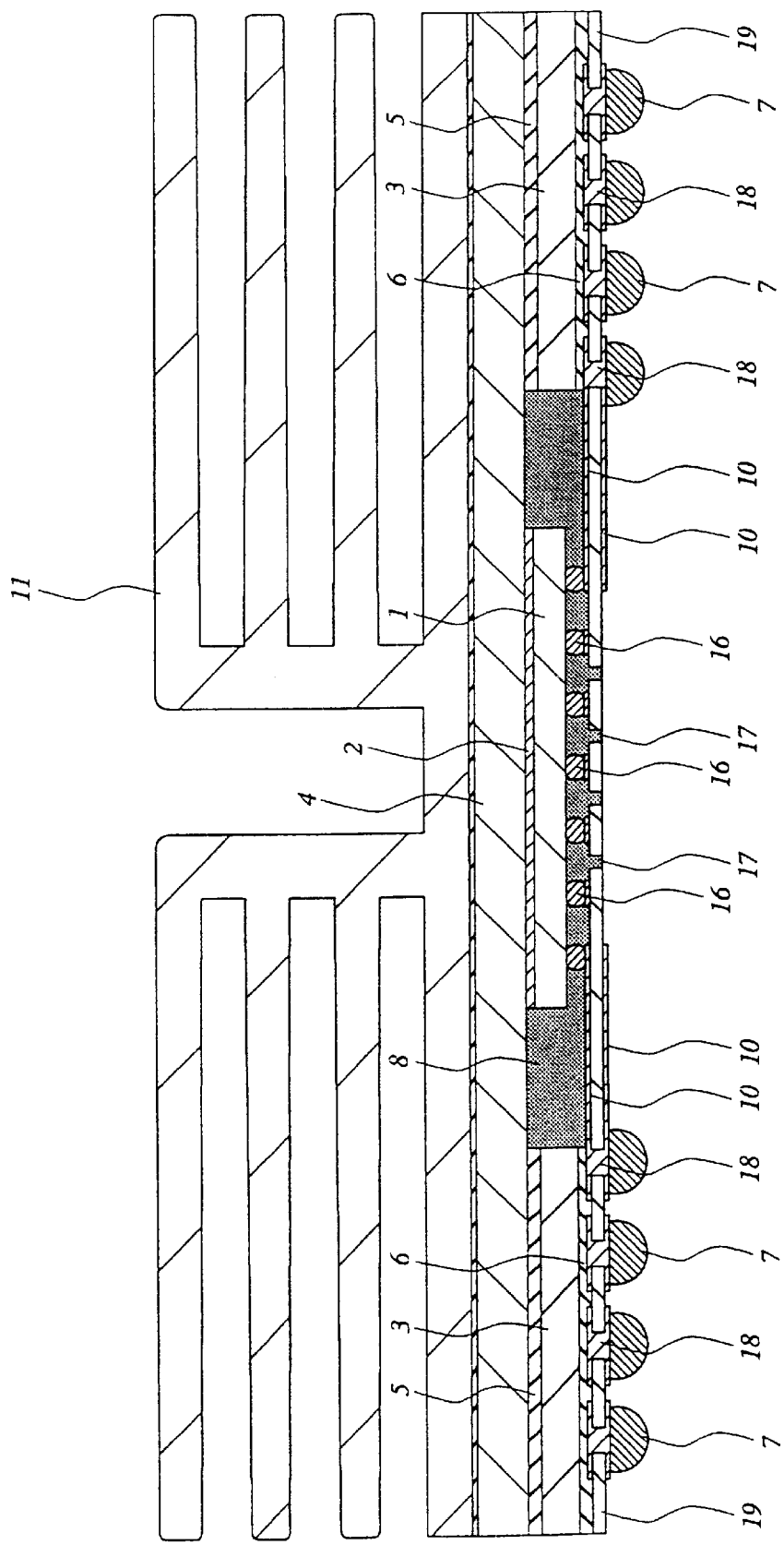
FIG. 13 is a sectional view of the semiconductor device according to the third embodiment of the present invention, on which heat radiation fins are installed.

As shown in FIG. 13, in the package in the third embodiment, by installing the heat radiation fins 11 on the heat sink 4, the package is applicable to LSIs which have multiple pins and consume a larger amount of electric power.

Figure 14:
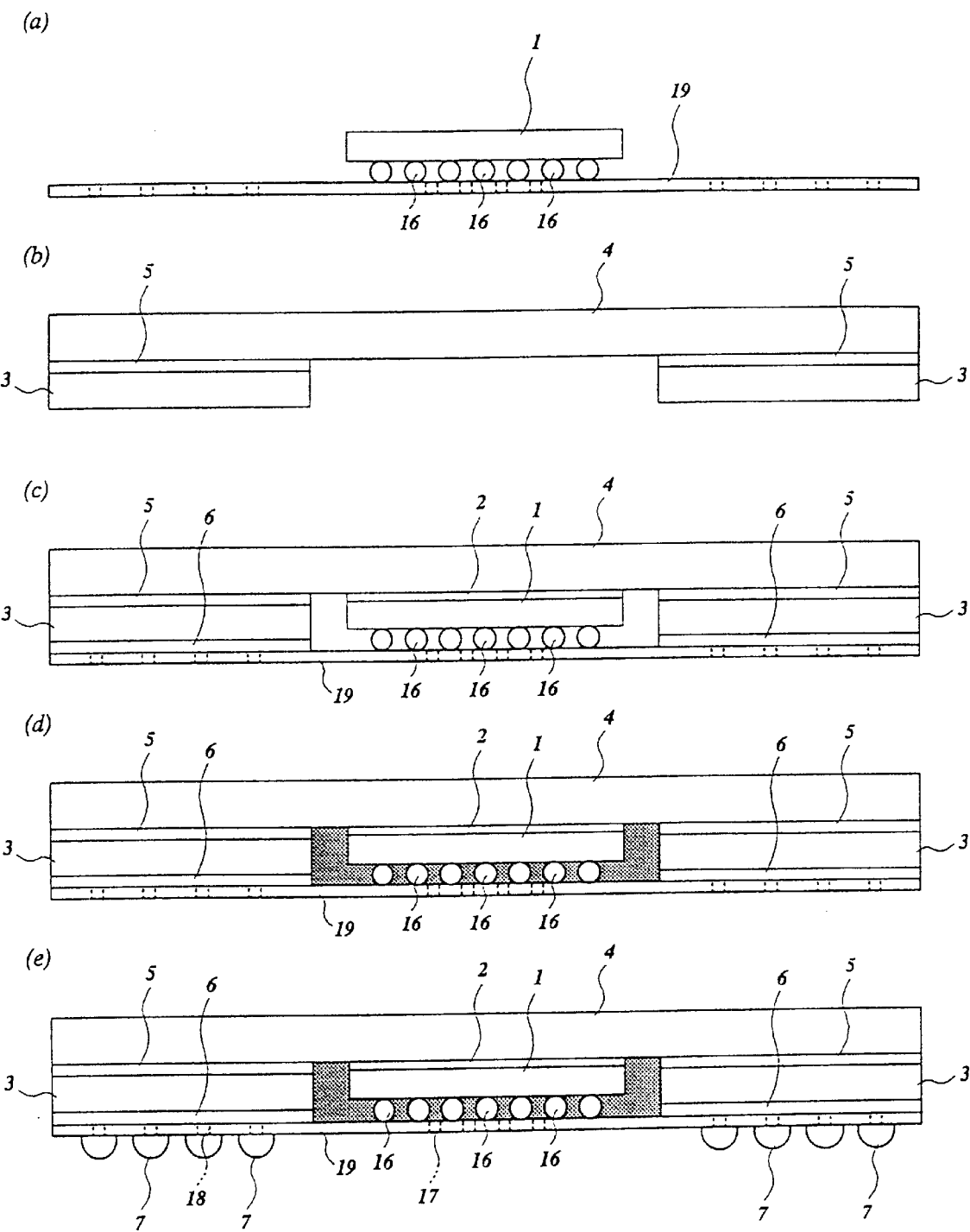
FIG. 14 is a process diagram showing the manufacturing process of the semiconductor device according to the third embodiment of the present invention.

With reference to FIG. 14, the assembly process of the semiconductor device according to the third embodiment will be described.

As shown in FIG. 14(*a*), a semiconductor chip 1 and a flexible tape 19 are electrically connected by the flip-chip method. A stiffener 3 is glued to the peripheral portion of one surface of the heat sink 4 with a first adhesive 5 as shown in FIG. 14(*b*). Then, as shown in FIG. 14(*c*), a semiconductor chip 1 is bonded to the central portion of one surface of the heat sink 4 with an Au—Sn eutectic alloy 2, and a flexible tape 19 is glued, using a second adhesive 6, to the other surface of the stiffener 3 having the heat sink 4 already glued thereto. As shown in FIG. 14(*d*), after a sealing resin 8 is filled in the cavity region without leaving any space through via holes 17 formed in the flexible tape 19, solder bumps 7 are formed on the flexible tape 19 so as to be electrically connected to the wiring 10.

Fourth Embodiment

Figure 15:
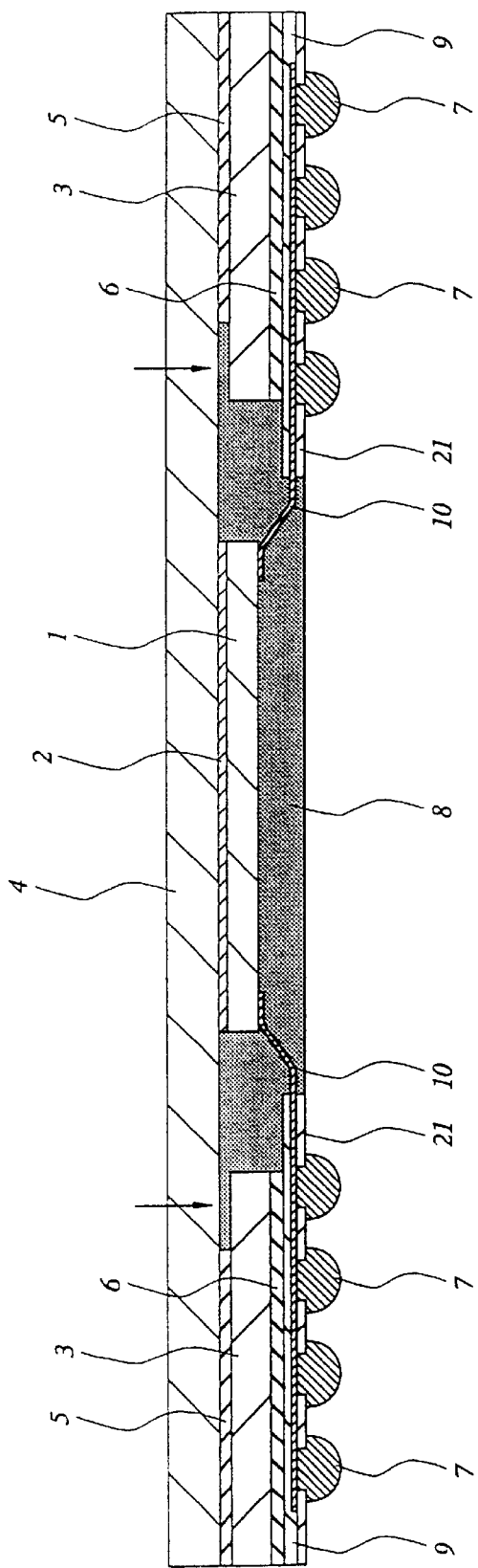
FIG. 15 is a sectional view showing a semiconductor device according to a fourth embodiment of the present invention.

FIG. 15 is a sectional view showing the semiconductor chip according to a fourth embodiment of the invention.

A silicon adhesive 5 with a low elastic modulus does not have a sufficient glueability with respect to the sealing resin 8 for sealing the semiconductor chip 1. In this respect, in the fourth embodiment, the amount of the adhesive 5 is decreased and instead the sealing resin 8 is applied to a part of the junction between the stiffener 3 and the heat sink 4 (as indicated with arrows in FIG. 15). By so doing, the contact area of the sealing resin with the stiffener 3 and the heat sink 4 is increased, so that the separation of the sealing resin 8 can be prevented and the reliability of the package is improved.

Fifth Embodiment

Figure 16:
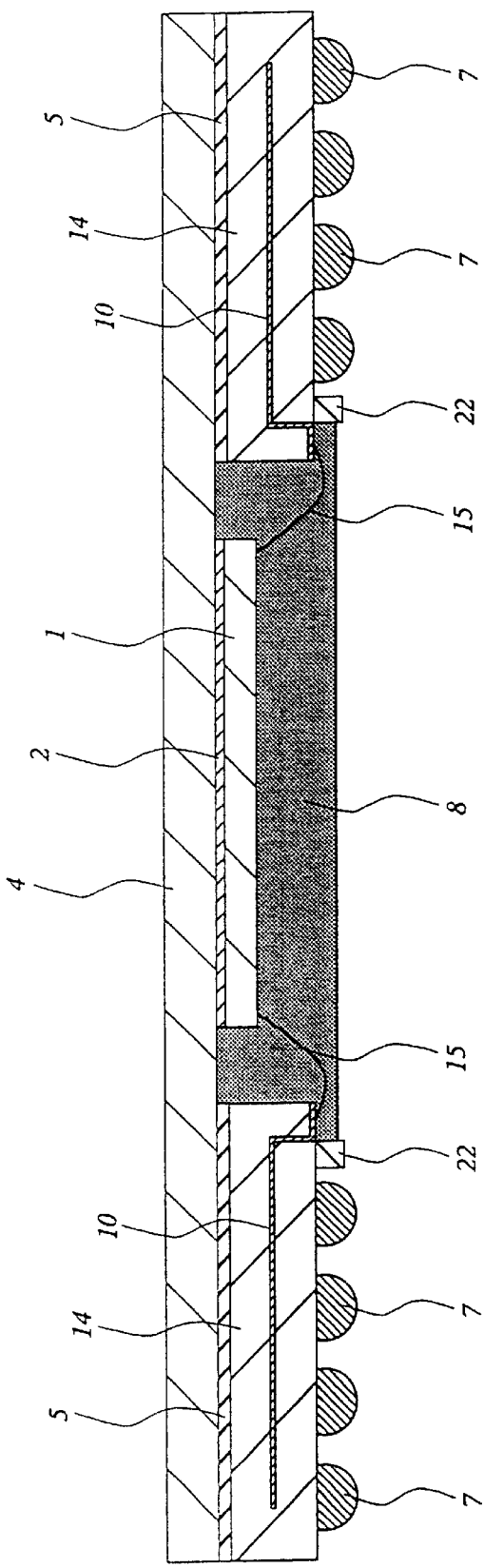
FIG. 16 is a sectional view showing a semiconductor device according to a fifth embodiment of the present invention.

FIG. 16 is a sectional view of the semiconductor device according to a fifth embodiment of the invention.

If there is no difference in level between the region where the wires 15 are connected and the region where solder bumps 7 are formed at the underside of the stiffener 14 as in the package shown in FIG. 8 of the second embodiment, it is necessary to apply the sealing resin 8 in a great thickness to prevent the wires 15 from being exposed from the sealing resin 8. In this case, by providing a dam 22 on that portion of the stiffener which surrounds the cavity region, the work of filling the sealing resin 8 can be made easy.

Sixth Embodiment

Figure 17:
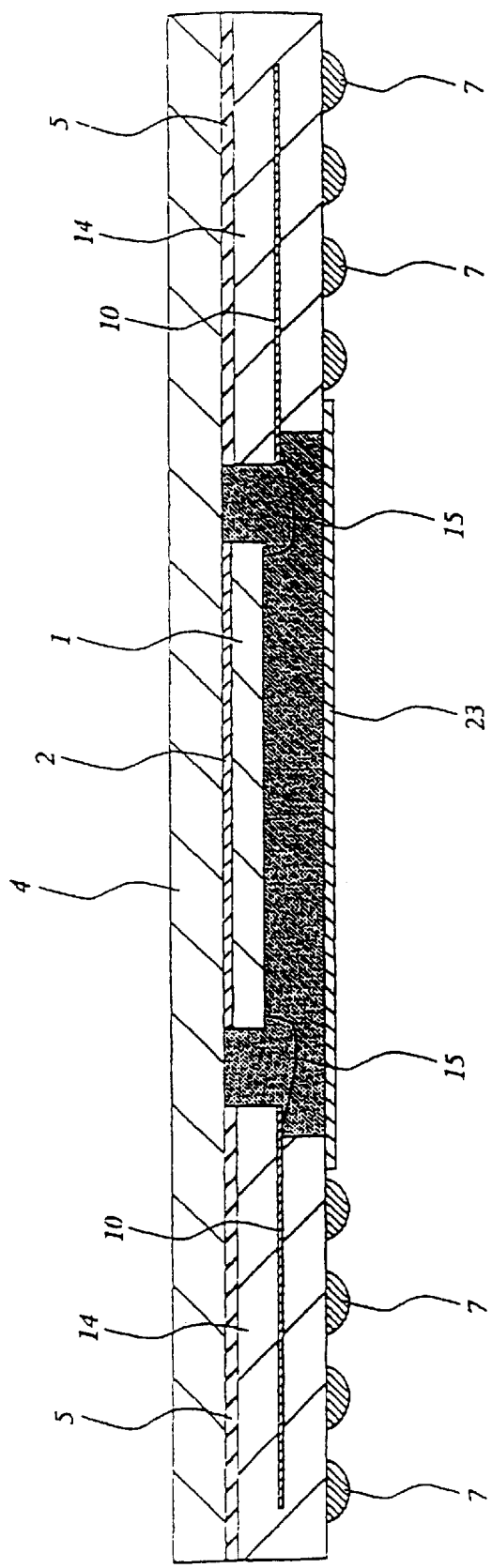
FIG. 17 is a sectional view showing a semiconductor device according to another embodiment of the present invention.

FIG. 17 is a sectional view of the semiconductor device according to a sixth embodiment of the invention.

In the package according to the sixth embodiment, the sealing resin 8 is formed of a silicon gel, and the silicon gel is air-tightly sealed with aluminum can sealing material. In the package structured as described, by gluing the heat sink 4 to the stiffener 3 with an adhesive 5 with a low elastic modulus, stresses caused by differences in thermal expansion coefficient of the respective members of the package can be absorbed or relaxed with the adhesive 5. Therefore, it is possible to prevent package crack or breaking of the wires 15 due to thermal stress produced when the package is mounted on the circuit board or when the LSI operates.

A TAB tape 9 is glued to the stiffener 3 with an epoxy adhesive 6. The semiconductor chip 1 is sealed with an epoxy sealing resin 8 with an elastic modulus of 10 GPa or more for protection against the outside.

Description has been made of preferred embodiments of the invention that were made by the inventor. However, the invention is not limited to those embodiments, but obviously many modifications and variations of the invention are possible without departing from the spirit or scope of the invention.

Industrial Applicability

As has been described, the semiconductor device according to the present invention has a package structure in which the high heat radiation characteristic and the high reliability are compatible, and is suitable for application as a BGA type package.

What is claimed is:

1. A semiconductor device comprising:

a heat sink having a surface;

a semiconductor chip bonded on the surface of the heat sink;

a stiffener having a first surface and a second surface which is opposite from the first surface and bonded on the surface of the heat sink via a first adhesive in such a way as to surround said semiconductor chip in plan;

a plurality of wirings bonded over the second surface of the stiffener via a second adhesive; and a plurality of solder bumps formed on the wirings, respectively, wherein the second adhesive has higher elastic modulus than that of the first adhesive, and wherein a thickness of the stiffener is larger than that of the wirings.

2. A semiconductor device according to claim 1, further comprising a sealing resin which seals said semiconductor chip, wherein said sealing resin has a higher elastic modulus than that of the first adhesive.

* * * * *